United States Patent
Rysinski et al.

(10) Patent No.: US 8,368,570 B2
(45) Date of Patent: Feb. 5, 2013

(54) METHOD AND SYSTEM FOR CALIBRATING COLUMN PARALLEL ADCS

(75) Inventors: Jeff Rysinski, Pasadena, CA (US); Yibing Michelle Wang, Temple City, CA (US); Sang-Soo Lee, Cupertino, CA (US)

(73) Assignee: SK Hynix Inc., Gyeonggi-do (KR)

( * ) Notice: Subject to any disclaimer, the term of this patent is extended or adjusted under 35 U.S.C. 154(b) by 186 days.

(21) Appl. No.: 13/018,165

(22) Filed: Jan. 31, 2011

(65) Prior Publication Data

US 2012/0194368 A1   Aug. 2, 2012

(51) Int. Cl.
*H03M 1/06* (2006.01)

(52) U.S. Cl. ...................................... 341/118; 341/155

(58) Field of Classification Search ................ 341/118, 341/120, 155, 156, 172, 119, 139, 121, 131, 341/159
See application file for complete search history.

(56) References Cited

U.S. PATENT DOCUMENTS

| 5,644,308 | A | * | 7/1997 | Kerth et al. .................. 341/120 |
| 2008/0019472 | A1 | | 1/2008 | Muramatsu et al. |
| 2008/0111059 | A1 | | 5/2008 | Lee et al. |

* cited by examiner

*Primary Examiner* — Joseph Lauture
(74) *Attorney, Agent, or Firm* — William Park & Associates Ltd.

(57) ABSTRACT

Various embodiments of the invention include enabling, during a calibration phase, a counter to count one less than a number of clock periods associated with a determined offset. The counted number of the clock periods is stored in calibration memory. In a conversion phase, inverted outputs are loaded from the calibration memory to the counter, where the counter is enabled to count the clock periods to determine a digital equivalent value of an analog signal amplitude.

24 Claims, 8 Drawing Sheets

METHOD AND SYSTEM FOR CALIBRATING COLUMN PARALLEL ADCS

FIELD OF THE INVENTION

Certain embodiments of the invention relate to processing signals, and More specifically, certain embodiments of the invention relate to a method and system for calibrating column parallel analog to digital converters (ADCs).

BACKGROUND OF THE INVENTION

As computers and processors become more powerful, more and more signal processing is being done in the digital domain. Digital signal processing can perform complex operations to manipulate input data to approximate real world analog signals, and the operations can be performed in real time, or the digital data can be stored for future processing. Since real world signals exist as analog signals, these analog signals need to be converted to equivalent digital signals.

Analog to digital converters (ADCs) are used in many applications, such as, for example, converting analog control signals in industrial applications, audio signals in music, photographic images in digital cameras, and video images in digital video cameras. As with most circuits, there are many different types of ADCs where tradeoffs are made for different limitations. Some, such as the "flash" ADC, are relatively expensive in circuitry and layout space and, accordingly, limited in resolution since every additional bit requires doubling of the number of comparators, but very fast in conversion speed. Others, such as the ramp ADC, can be fairly simple but slow in conversion time. And as the amount of resolution increases, the conversion time will increase.

Accordingly, a particular application needs to take into account various limitations and determine which design best serves its purposes. However, picking a specific design, and possibly modifying it to improve its design, can still present certain challenges that need to be overcome.

For high resolution and high speed imaging, column parallel ADC architecture has become the most widely used ADC in CMOS image sensors. One key challenge to achieving good performance of CMOS image sensors is to reduce noise or other signal offsets from affecting the converted digital data.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention provide a method and system for calibrating column parallel analog to digital converters (ADCs). Aspects of the system may comprise enabling, during a calibration phase, a counter to count one less than a number of clock periods associated with a determined offset. The counted number of the clock periods is stored in calibration memory. In a conversion phase, inverted outputs are loaded from the calibration memory to the counter, where the counter is enabled to count the clock periods to determine a digital equivalent value of an analog signal amplitude. The short count by one and inverted outputs effectively give a two's complement of the number of clock periods that need to be counted.

Various embodiments of the invention may also comprise enabling, during a calibration phase, a counter to count a first number of clock periods associated with a determined calibration offset, wherein the first number is one less than a number of clock periods associated with a determined offset. The first number may be stored in a memory block. A second number of clocks periods may be counted, during a conversion period, to determine a digital equivalent value of an analog signal amplitude. The second number of clock periods may be stored in the memory block. A circuitry, such as, for example, a processor may have read an inverted version of the first number of clock periods from the memory block, and may add it to the second number of clock periods. The short count by one and inverted outputs effectively give a two's complement of the number of clock periods that need to be counted.

Another embodiment of the invention may provide a machine-readable storage, having stored thereon, a computer program having at least one code section executable by a machine, thereby causing the machine to operate as described above for calibrating column parallel analog to digital converters for converting analog signals to digital signals.

These and other advantages, aspects and novel features of the present invention, as well as details of an illustrated embodiment thereof, will be more fully understood from the following description and drawings.

DETAILED DESCRIPTION OF THE INVENTION

Embodiments of the present invention will be described in detail with reference to the accompanying drawings such that the scope of the present invention can be easily embodied by those skilled in the art.

Certain embodiments of the invention may be found in a method and system for calibrating column parallel analog to digital converters (ADCs).

Figure 1:
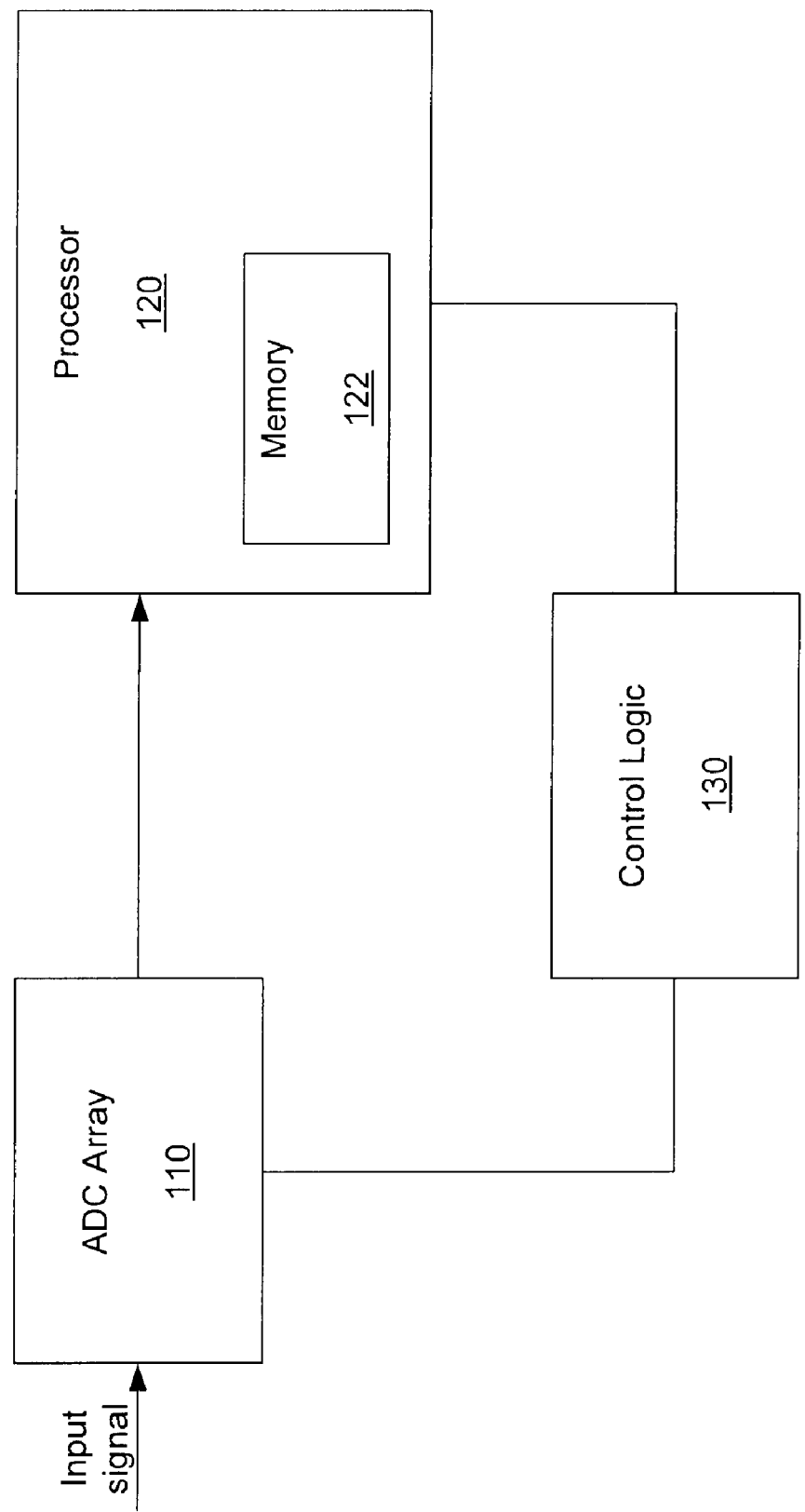
FIG. 1 is a block diagram of exemplary system for analog to digital conversion, in accordance with an embodiment of the invention.

FIG. 1 is a block diagram of exemplary system for analog to digital conversion and digital to analog conversion. Referring to FIG. 1, there is shown a portion of a circuitry for processing input data, comprising the ADC 110, the processor 120, and the control logic 130.

The ADC 110 converts input analog signals, such as, for example, pixel signals from a video image sensor (not shown in FIG. 1) to equivalent digital signals. The digital signals output by the ADC 110 may be further processed by the processor 120. The processor 120 may, for example, compress the digital signals from the ADC 110 to a standard format such as MPEG1, MPEG2, or MPEG4. The processor 120 may also comprise a memory block 122 where code may be stored. This code may be executed by the processor 120 to perform various functions. The memory block 122 may also be used to store digital signals from the ADC 110 and/or digital signals that result from processing the digital signal from the ADC 110.

The control logic 130 may comprise circuitry that outputs clocks, signals, and commands for a variety of modules, such as the ADC 110. For example, the control logic 130 may generate a clock signal that is used for counting in the ADC 110, where the clock signal is not continuously running. A running clock comprises pulses while a non-running clock is in one of a low state or a high state. The control logic 130 may also output enable signals that enable the counters in the ADC 110 to count during specific portions of time.

Figure 2:
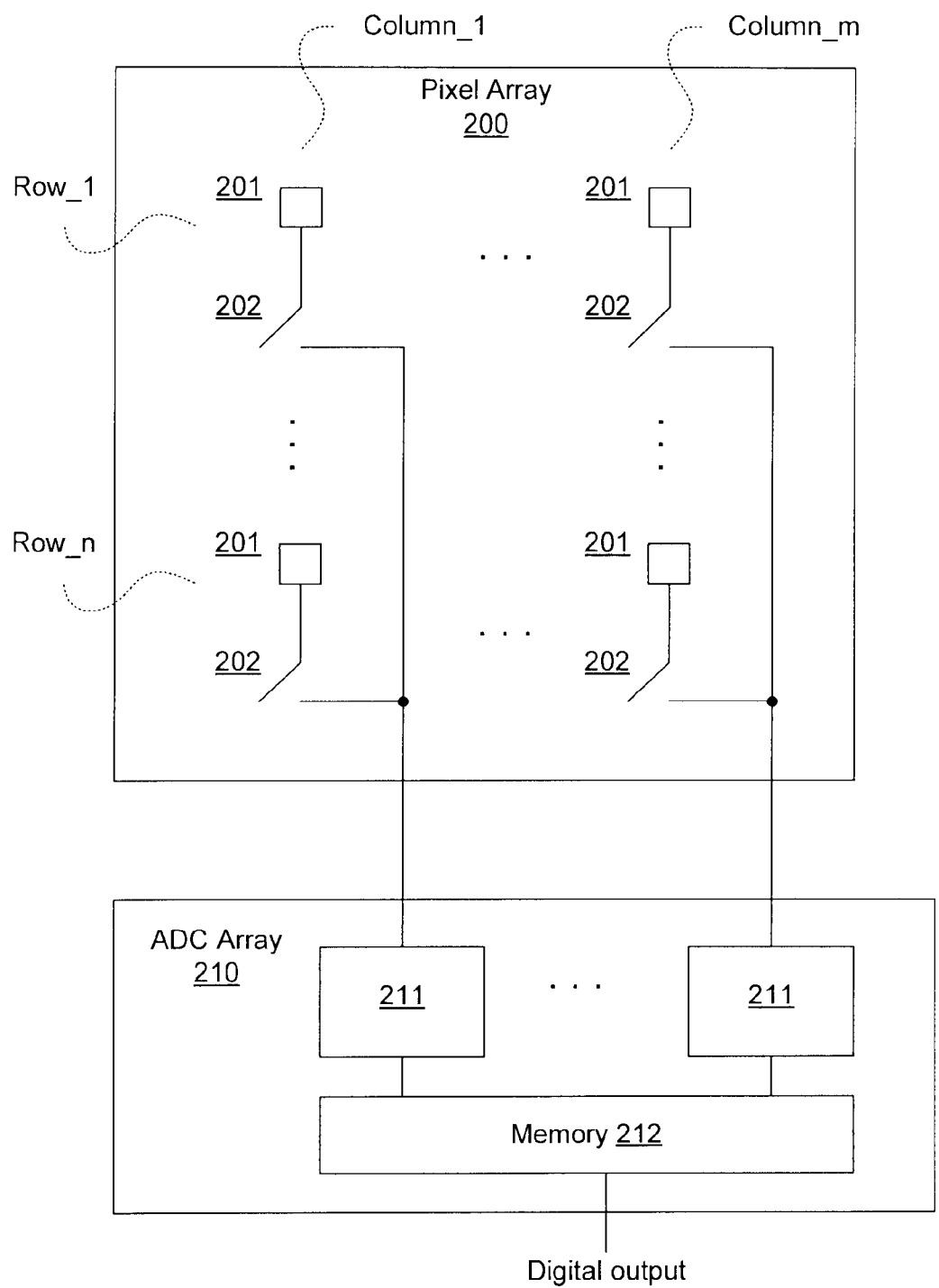
FIG. 2 is a block diagram of an exemplary system for column parallel analog digital converters, in accordance with an embodiment of the invention.

FIG. 2 is a block diagram of an exemplary column parallel analog digital converter configuration, in accordance with an embodiment of the invention. Referring to FIG. 2, there are shown a pixel array 200 and an ADC array 210. The pixel array 200 may comprise pixel elements 201 and switching elements 202. The pixel elements 201 may comprise suitable circuitry that outputs, for example, voltage proportional to an amount of light detected by the pixel element 201. The pixel element 201 may be sensitive to specific wavelengths of the impinging light. The ADC array 210 may comprise, for example, an array of ADC elements 211, where each ADC element 211 may correspond to a column of the pixel elements 201. The outputs of the ADC elements 211 may be stored in a memory block 212.

In operation, appropriate control signals from, for example, the control logic 130 may enable the switching elements 202 to open and close appropriately so that output voltage from a particular pixel element 201 is communicated to the ADC array 210. Accordingly, for each column Column_1 to Column_m, only one particular switch element 202 in all of the rows Row_1 to Row_n may be closed so that output voltage from the corresponding pixel element 201 is communicated to the ADC array 210.

The output voltage from one of the pixel elements 201 in a column Column_1 to Column_m may be converted to an equivalent digital value by a corresponding ADC element 211. However, since there is a plurality of ADC elements 211, each ADC element 211 may need to be calibrated so that each ADC element 211 outputs a similar digital value for a given input. Calibration may be done periodically, for example, such as once during a row scan time or once during a frame. The particular period for calibration may be design and/or implementation dependent.

Figure 3:
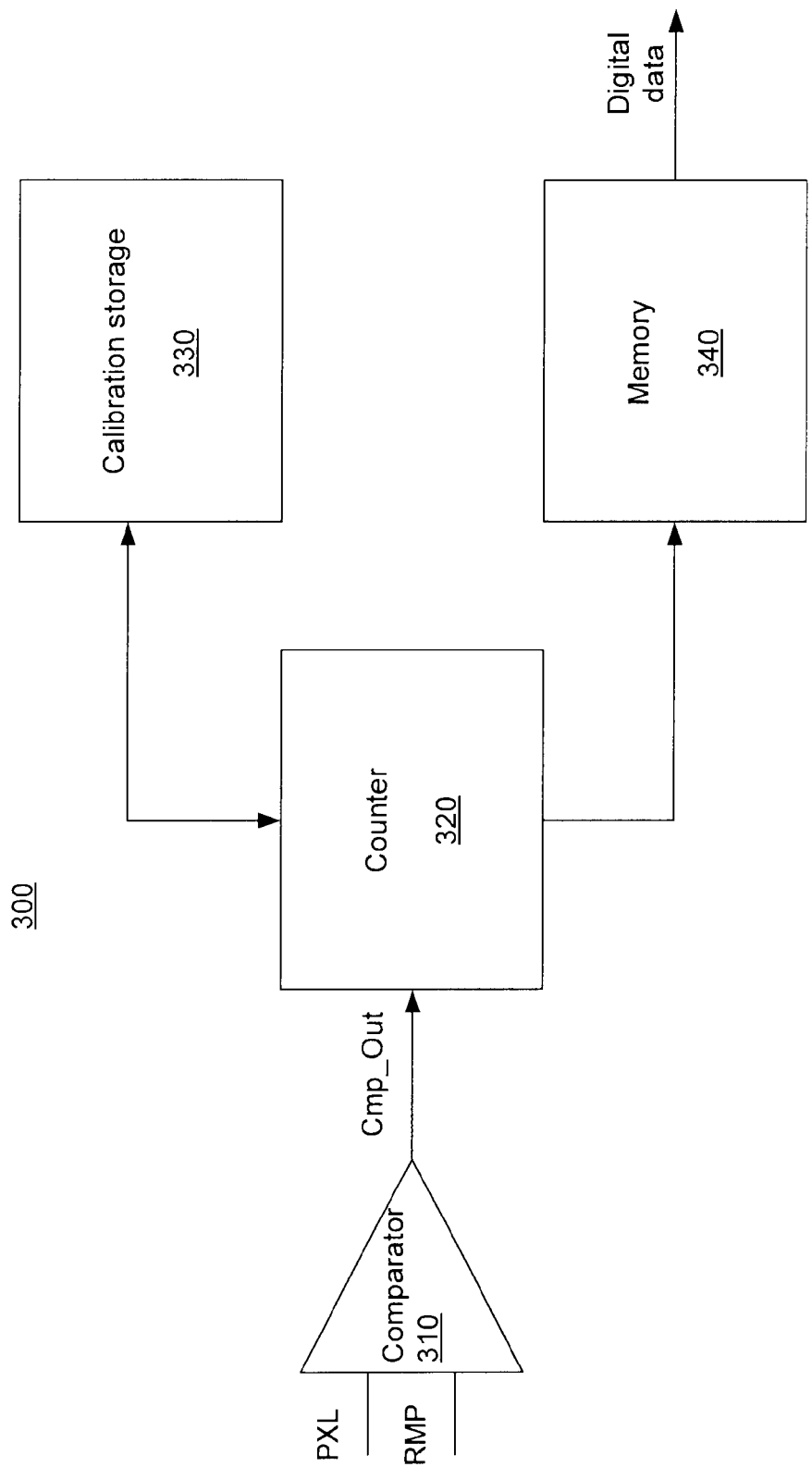
FIG. 3 is a block diagram of an exemplary system for analog to digital conversion, in accordance with an embodiment of the invention.

FIG. 3 is a block diagram of an exemplary system for analog to digital conversion, in accordance with an embodiment of the invention. Referring to FIG. 3, there is shown an ADC element 300, which may be similar to the ADC element 211, comprising comparator 310, counter 320, calibration memory 330, and memory block 340.

The comparator 310 may have as inputs a pixel signal PXL from, for example, the pixel array 200, and a ramp signal RMP from, for example, the control logic 130. The comparator 310 may compare the input signals and assert an output when the ramp signal and the pixel signal are substantially equal to each other. The counter 320 may be an up-counter that receives a load signal LD, an enable signal EN, a clear signal CLR, and a clock signal CLK from, for example, the control logic 130. The various command signals are not shown in FIG. 3. If needed, the counter 320 may be loaded with a value, and when enabled by the enable signal, start counting from the loaded value with each rising edge of the clock signal. The clear signal CLR may be equivalent to loading the counter with a value of zeros.

The calibration memory 330 may comprise suitable circuitry for storing a calibration value. The calibration memory 330 may comprise, for example, circuitry that has inverted outputs and non-inverted outputs. This calibration value may be loaded in to the counter 320 with the load signal LD. The memory block 340 may comprise suitable circuitry for storing digital values corresponding to the input pixel signal, where the digital values are outputs of the counter 320. The memory block 340 may be various sizes depending on implementation. The memory block 340 may be, for example, large enough to hold the digital values corresponding to a row of pixels.

In operation, there may be two phases of operation for the ADC element 300. One phase is the calibration phase, and the other phase is the conversion phase. During the calibration phase, the comparator 310 may be reset via a reset signal RST (not shown) from, for example, the control logic 130, and the pixel signal PXL may be set to a calibration voltage. The calibration voltage may be from, for example, the pixel array 200 where an additional switch element 202 may be closed to output the calibration voltage to the respective ADC element 211. The calibration voltage may have been determined, for example, during manufacturing of the comparators 310. The counter 320 is cleared to zero and enabled to count via the clear signal CLR and the enable signal EN, respectively.

The input ramp signal RMP may start to ramp down and the counter 320 may start to count via the running clock signal CLK. When the ramp signal RMP is substantially the same voltage as the calibration voltage of the input signal PXL, the comparator 310 asserts its output signal. The asserted output signal from the comparator 310 may be used to disable counting by the counter 320. The count from the counter 320 is then saved in the calibration memory 330. This stored count may be used for calibration offset when converting the input signal PXL to equivalent digital values during the conversion phase.

Additionally, various embodiments of the invention may allow the counter 320 to start counting after a first period of the running clock signal CLK. Accordingly, the count by the counter 320 may be one less than the actual number of CLK periods in the time from start of the ramp signal RMP to when the ramp signal RMP is substantially the same voltage as the input signal PXL.

During the conversion phase, an inverted value of the stored count in the calibration memory 330 may be loaded in to the counter 320. Accordingly, the counter 320 is effectively loaded with a two's complement of the calibration offset counted by the counter 320 during the calibration phase. Therefore, during the conversion phase, the counter 320 first counts the calibration offset to reach a count of zero, and then starts counting from zero to convert the input signal PXL to an equivalent digital value where the offset is automatically taken into account.

Accordingly, during the conversion phase, the comparator 310 may be reset via a reset signal RST from, for example, the control logic 130 and the pixel signal PXL may be received from the pixel array 200. The counter 320 loaded with the two's complement of the calibration offset and enabled to count via the load signal LD and the enable signal EN, respectively.

The input ramp signal RMP may start to ramp down, and the counter 320 may start to count via the running clock signal CLK. When the ramp signal RMP is substantially the same voltage as the voltage of the input signal PXL, the comparator 310 asserts its output signal. The asserted output signal from the comparator 310 may be used to disable counting by the counter 320. The count from the counter 320 is then saved in the memory block 340 as digital value corresponding to the analog voltage from the pixel array 200. The processor 120 from FIG. 1 may then access the digital values for further processing. This may include, for example, storing the digital values in the memory block 122 for local access by the processor 120.

Figure 4:
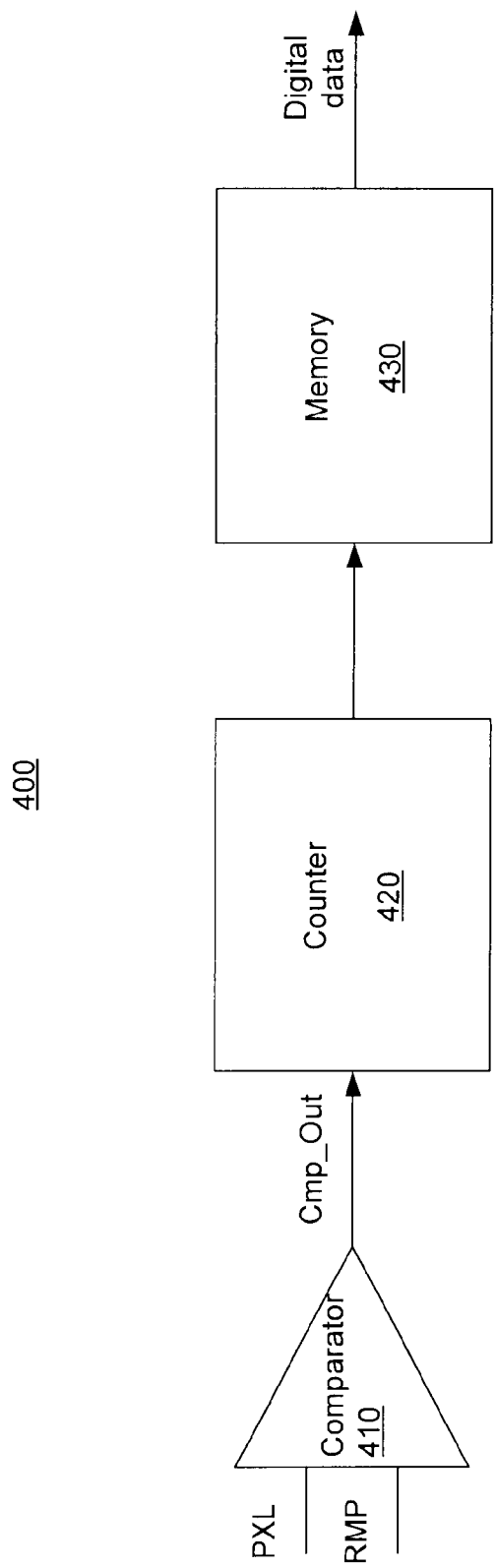
FIG. 4 is a block diagram of an exemplary system for analog to digital conversion, in accordance with an embodiment of the invention.

FIG. 4 is a block diagram of an exemplary system for analog to digital conversion, in accordance with an embodiment of the invention. Referring to FIG. 4, there is shown an ADC element 400, which may be similar to the ADC element 211, comprising comparator 410, counter 420, and memory block 430. The comparator 410, the counter 420, and the memory block 430 may be similar to the corresponding modules described with respect to FIG. 3. Again, various command signals are not shown.

In operation, similarly to operation of an embodiment of the invention described with respect to FIG. 3, there may be two phases of operation for the ADC element 400. One phase is the calibration phase, and the other phase is the conversion phase. During the calibration phase, the comparator 410 may be reset via a reset signal RST from, for example, the control logic 130, and the pixel signal PXL may be set to a calibration voltage. The calibration voltage may be from, for example, the pixel array 200 where an additional switch element 202 may be closed to output the calibration voltage to the respective ADC element 211. The calibration voltage may have been determined, for example, during manufacturing of the comparators 410. The counter 420 is cleared to zero and enabled to count via the clear signal CLR and the enable signal EN, respectively.

The input ramp signal RMP may start to ramp down and the counter 420 may start to count via the running clock signal CLK. When the ramp signal RMP is substantially the same voltage as the calibration voltage of the input signal PXL, the comparator 410 asserts its output signal. The asserted output signal from the comparator 410 may be used to disable counting by the counter 420. The count from the counter 420 is then saved in the memory block 430. This stored count corresponding to an offset value may be read by, for example, the processor 120. The processor 120 may then subtract the offset value for each digital value read from the memory block 430.

Additionally, various embodiments of the invention may allow the counter 320 to start counting after a first period of the running clock signal CLK. Accordingly, a calibration count by the counter 420 may be one less than the actual number of CLK periods in the time from start of the ramp signal RMP to when the ramp signal RMP is substantially the same voltage as the input signal PXL. The calibration count for each comparator in the ADC array 210 may then be stored in the memory block 430.

In some embodiments of the invention, the memory block 430 may be implemented such that non-inverted values or inverted values may be read from the memory block 430. Accordingly, the inverted values may be read by the processor 120 and the resulting two's complement of the calibration count may be added to the converted digital values generated during the conversion phase. This may reduce processing overhead for the processor 120 so that it does not have to calculate two's complement in order to subtract the calibration count.

Accordingly, during the conversion phase, the comparator 410 may be reset via a reset signal RST from, for example, the control logic 130 and the pixel signal PXL may be received from the pixel array 200. The counter 420 is cleared to zero and enabled to count via the clear signal CLR and the enable signal EN, respectively.

The input ramp signal RMP may start to ramp down, and the counter 420 may start to count via the running clock signal CLK. When the ramp signal RMP is substantially the same voltage as the voltage of the input signal PXL, the comparator 410 asserts its output signal. The asserted output signal from the comparator 410 may be used to disable counting by the counter 420. The count from the counter 420 is then saved in the memory block 430 as equivalent digital values to the analog voltage from the pixel array 200. The processor 120 from FIG. 1 may then access the digital values for further processing. This may include, for example, storing the digital values in the memory block 122 for local access by the processor 120.

As stated previously, the processor 120 may subtract the calibration count from the digital values generated during the conversion phase. Accordingly, the processor 120 may subtract a corresponding calibration count from each digital value from each row of a given column. The subtraction may be simplified for the processor 120 by reading a two's complement of the calibration count from the ADC array 210.

Since the ADC element 400 does not subtract the calibration offset before converting the analog signal, the dynamic range of the counter 420 may be reduced by whatever the count may be for the calibration offset. To compensate for this, the size of the counter 420 may be increased by, for example, an additional bit.

Figure 5:
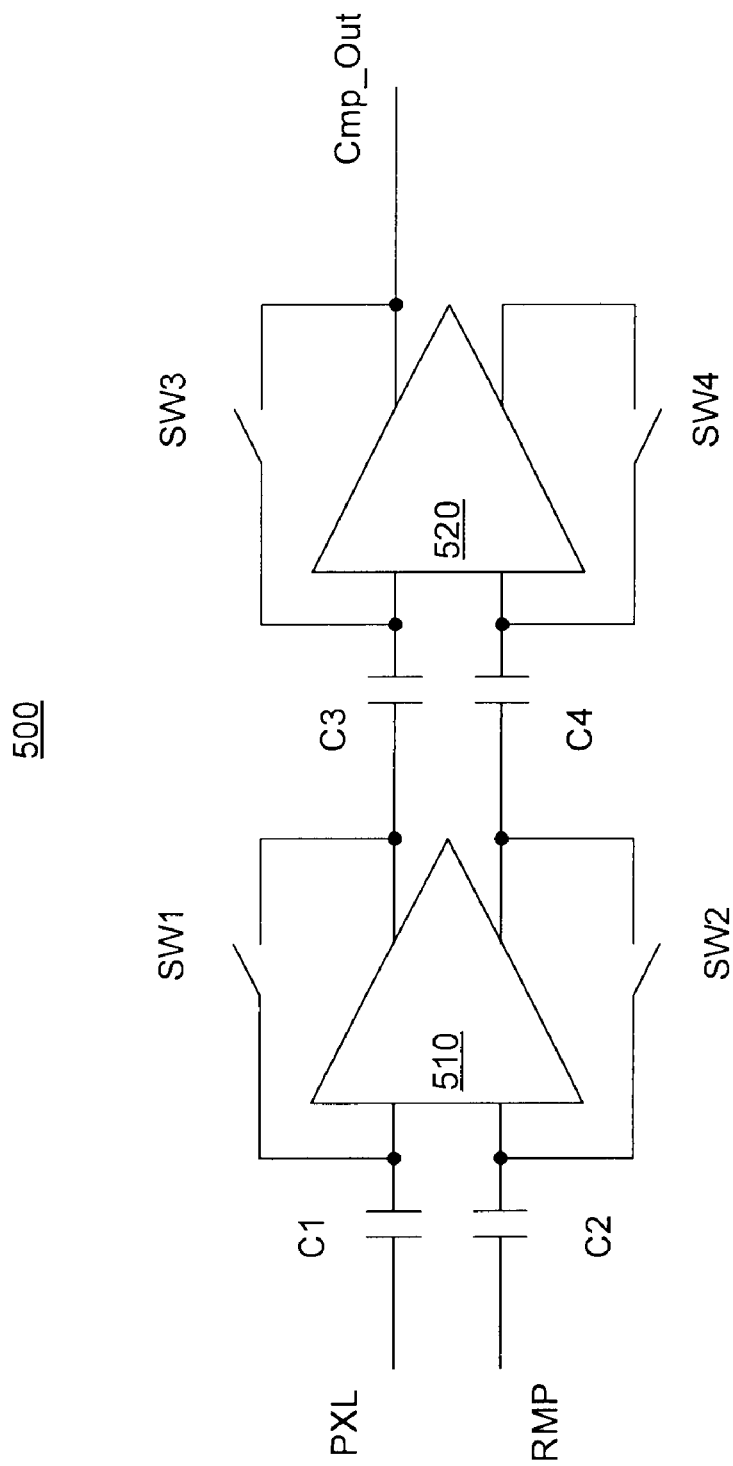
FIG. 5 is a block diagram of an exemplary comparator architecture, in accordance with an embodiment of the invention.

FIG. 5 is a block diagram of an exemplary comparator architecture, in accordance with an embodiment of the invention. Referring to FIG. 5, there is shown a comparator element 500, which may be similar to the comparator element 211, comprising comparators 510 and 520, coupling capacitors C1, C2, C3, and C4, and switching elements SW1, SW2, SW3, and SW4.

In operation, the switching elements SW1, SW2, SW3, and SW4 may be closed by a command from, for example, the control logic 130 to reset inputs of the comparators 510 and 520 to a known state. The switching elements SW1, SW2, SW3, and SW4 may then be opened and the input signals PXL and RMP may be applied.

While a two-stage comparator is shown in FIG. 5, the invention need not be so limited. Various types of comparators, including single stage, or other multi-stage, can be used to compare voltage levels of two input signals.

Figure 6:
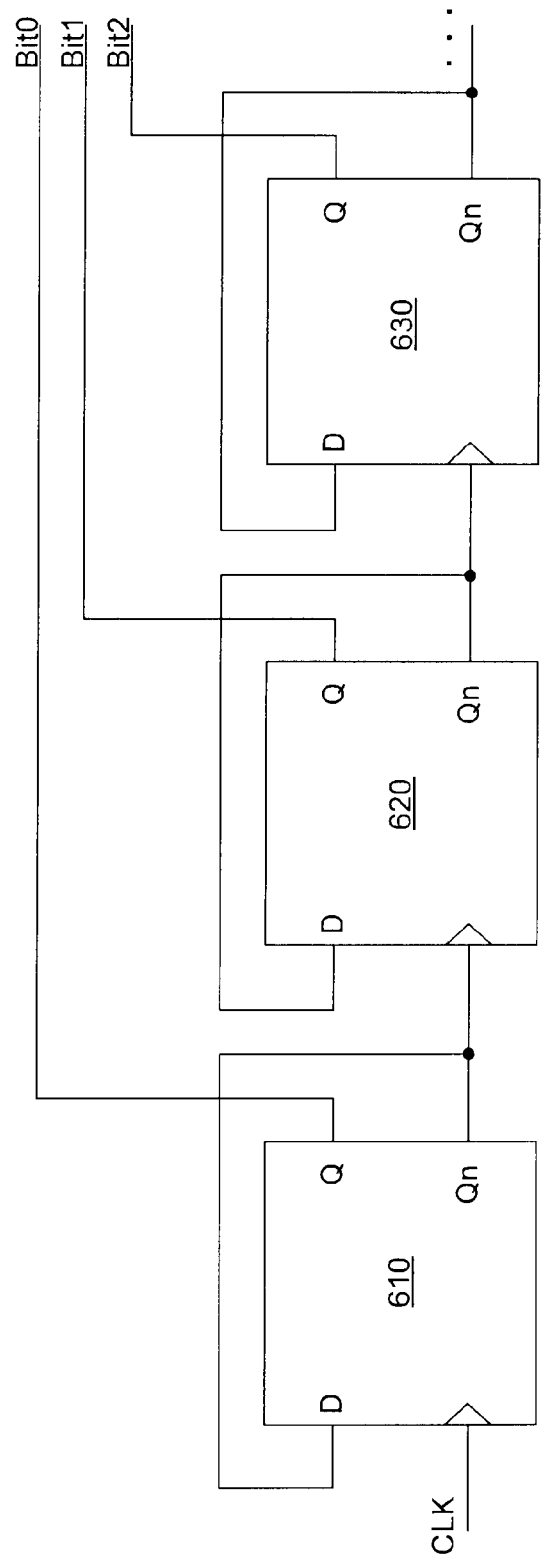
FIG. 6 is a block diagram of an exemplary ripple up counter.

FIG. 6 is a block diagram of an exemplary ripple up counter. Referring to FIG. 6, there is shown a simple ripple counter comprising D flip-flops 610, 620, and 630. An input clock may drive the first D flip-flop 610 and the non-inverted output Q may be a least significant bit Bit0 of the counter. The inverted output Qn of the D flip-flop 610 is the clocking signal for the next D flip-flop 620. The Q output of the D flip-flop 620 is the next least significant bit Bit1. Additional D flip-flops may be added to the circuit for the desired number of count bits.

While an asynchronous counter has been described, the invention need not be so limited. For example, a synchronous counter can also be used. However, a synchronous counter may require more circuitry than an asynchronous counter. Also, various features of a counter have not been shown. For example, depending on an application, it may be desirable for a counter to be able to load a value from which to start count, to be able to clear the counter to zero, and to have an enable signal to control the counter.

Figure 7:
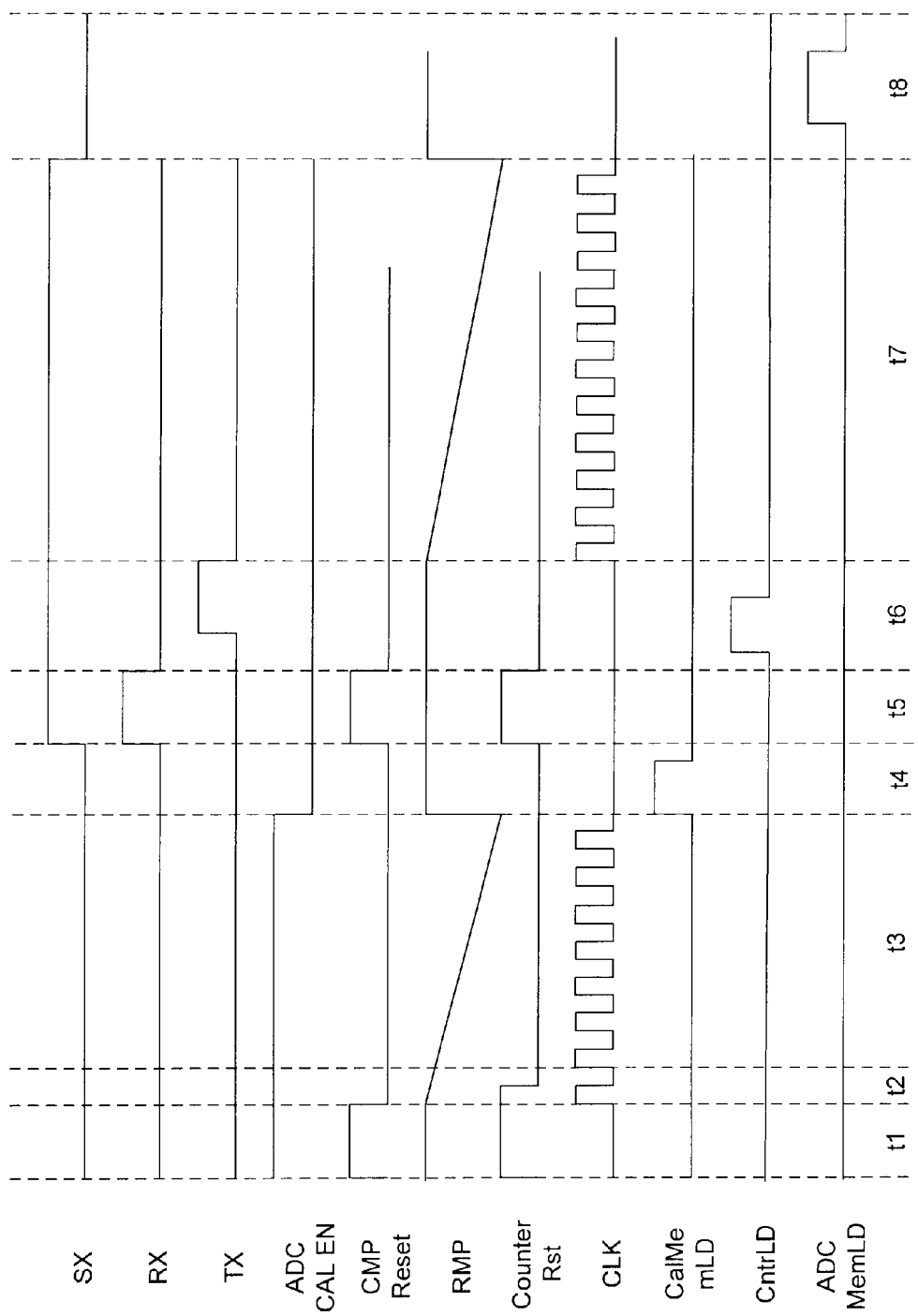
FIG. 7 is an exemplary timing diagram for the analog to digital conversion system described in FIG. 3, in accordance with an embodiment of the invention.

FIG. 7 is an exemplary timing diagram for the analog to digital conversion system described in FIG. 3, in accordance with an embodiment of the invention. Referring to FIG. 7, there is shown a timing diagram for a calibration phase followed by a conversion phase, where periods t1 to t8 are shown. The timing diagram will be described with referring to FIG. 3. In the periods t1 to t4, the comparator/counter/memory propagation delay may be measured. This may require a special calibration row during, for example, the vertical blanking time. During period t1 the counter 320 is reset, the comparator 310 is reset, and the comparator inputs PXL and RMP are sampled. For the calibration phase a DC calibration voltage may be used. The calibration voltage should be selected instead of a signal from a column pixel element 201. This may occur, for example, when the ADC Calibration Enable signal ADC CAL EN is asserted during periods t1 through t3.

At the beginning of period t2, the ramp signal RMP starts to ramp down. Also during a portion of period t2, the counter 320 is held in a reset state, for example, by using the enable signal EN. Accordingly, the rising edge of the clock signal CLK will not increment count of the counter 320. This effectively has the counter 320 count one less clock period than it should. When this short count is inverted, then a two's complement of the number of clock periods counted in the calibration phase is generated.

The reason for generating a two's complement number is that subtracting a number is the same as adding a two's complement of that number. Since space is generally limited in a semiconductor chip, a simple method such as this is advantageous. A clock used to generate the ramp signal RMP and the counter clock CLK are synchronized. Hence, if the counter 320 is held in reset for the first clock cycle the final count will be n−1 periods, rather than n periods. The count can then be loaded into the calibration memory 330, which may comprise, for example, latches. Since a latch has both non-inverted and inverted outputs, the inverted output can be chosen. This means that the chosen output will be two's complement of the calibration count.

During the period t3, the counter clock CLK is run for some fixed time to measure the ADC offset. The ramp signal RMP is output until it is substantially the same voltage as the calibration voltage of the input signal PXL. The ramp time can be much shorter than a typical ramp cycle since the offset values should be relatively small. However, it should be noted that since the row time is fixed, the calibration ramp time can be run to accommodate a wide range of offset values up to the full scale value.

At the beginning of period t4, the calibration ramp cycle has ended and the counter value of the counter 320 should be loaded into the calibration memory 330. This may occur when the calibration memory load signal CAL MEM LD is asserted during period t4.

During the periods t5 to t8, image readout takes place. Pixel signals in the optical rows are converted to digital values. Each row is selected in turn (denoted generally by the select signal SX). The pixels in the selected row are reset (denoted by the reset signal RX) and the comparators 211 are reset by the comparator reset signal CMP RST. The comparator reset signal CMP RST may close the switching elements SW1, SW2, SW3, and SW4 for each comparator 211 for a period of time. The counter is also reset (by the counter reset signal Counter Rst) to bring it to a known state.

During the period t6, the comparators 211 are taken out of reset and the pixel voltages are sampled on C1 (TX). This is the same capacitor used for the pixel reset voltage so this process is the analog correlated double sampling (CDS). The other comparator input is switched to the ramp signal RMP, which is still at the ramp reset level. The counter may be loaded with the two's complement of the calibration value from the calibration memory 330 via the counter load signal CntrLD.

During the period t7, the optical signal is ready to be converted. The ramp signal RMP starts ramping down and the counter clock signal CLK runs for a fixed period of time long enough to complete a full conversion. The counter 320 in each column starts at '−n' so that the calibration value is subtracted from the converted signal value that contains the offset.

During the period t8, the counter clock signal CLK stops running and the ramp is reset to its default level. The final converted signal value is loaded into the memory block 340 by the signal ADC MemLD, and is ready for readout by the processor 120. The next row can then be read by increasing the row address and returning to time t5.

Figure 8:
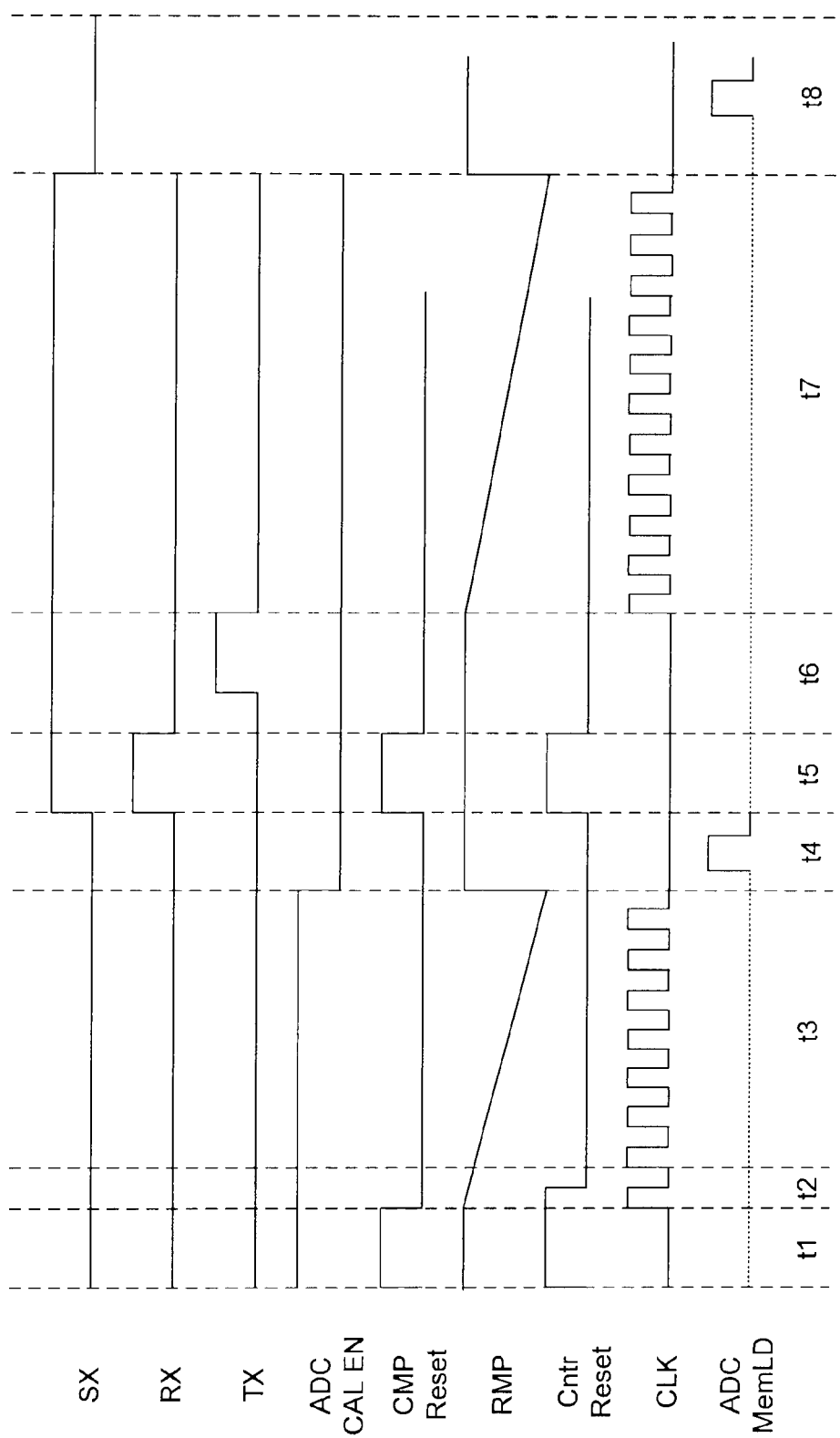
FIG. 8 is an exemplary timing diagram for the analog to digital conversion system described in FIG. 4, in accordance with an embodiment of the invention.

FIG. 8 is a timing diagram for the analog to digital conversion system described in FIG. 4, in accordance with an embodiment of the invention.

FIG. 8 is an exemplary timing diagram for the analog to digital conversion system described in FIG. 4, in accordance with an embodiment of the invention. Referring to FIG. 8, there is shown a timing diagram for a calibration phase followed by a conversion phase, where periods t1 to t8 are shown. The timing diagram will be described with referring to FIG. 4. The timing diagram of FIG. 8 is substantially similar to the timing diagram of FIG. 7. Accordingly, a sparse description will be provided except for the differences.

The calibration value is calculated during the calibration phase in periods t1 through t4. However, since there is no calibration memory in the configuration shown in FIG. 4, the calibration value from each comparator 211 are stored in the memory block 430 via the signal ADC MemLD. The memory block 430 may comprise latches. Accordingly, by reading out the inverted values, the processor 120 may have read two's complements of the calibration offset. Therefore, the processor 120 may directly add the two's complement values for each column to the corresponding converted digital signals in each column. These values may be used for all rows of a frame before new calibration offsets are calculated.

During the conversion phase in the periods t5 through t7, the process may be similar except that the counter 420 is not loaded with the calculation offset. Rather, the counter 420 starts counting from zero. Accordingly, the final count of the counter 420 is not compensated for calibration offset. This will be done by the processor 120 when it reads the converted digital values from the memory block 430.

During the period t8, the counter clock signal CLK stops running and the ramp is reset to its default level. The final converted signal value is loaded into the memory block 430 by the signal ADC MemLD, and is ready for readout by the processor 120. The next row can then be read by increasing the row address and returning to time t5.

Although some embodiments of the invention have been described, the invention is not so limited. For example, FIG. 1 describes an exemplary block diagram configuration. However, other configurations can also be used. For example, the memory block 122 can be shown as a separate memory block. Also, while not described explicitly, the asserted output of the comparator 310/410 may be communicated to the control logic 130, which may then assert/deassert various signals to stop the counters 320/420 from counting.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for converting an analog signal to a digital signal, the method comprising:
    enabling, during a calibration phase, a counter to count one less than a number of clock periods associated with a determined offset;
    storing the number of the clock periods in calibration memory; and
    loading, during a conversion phase, inverted outputs from the calibration memory to the counter, wherein the counter is enabled to count the clock periods to determine a digital equivalent value of an analog signal amplitude.

2. The method according to claim 1, wherein the analog signal is a pixel signal.

3. The method according to claim 1, wherein the clock periods correspond to a clock signal that is generated during a portion of each of the calibration phase and conversion phase.

4. The method according to claim 1, wherein a comparator compares a ramping signal with the analog signal.

5. The method according to claim 4, wherein the comparator is a two-stage comparator.

6. The method according to claim 1, comprising storing the digital equivalent value in a memory block.

7. A method for converting an analog signal to a digital signal, the method comprising:
    enabling, during a calibration phase, a counter to count a first number of clock periods associated with a determined calibration offset, wherein the first number is one less than a number of clock periods associated with a determined offset;
    storing the first number of the clock periods in a memory block;
    reading, by a circuitry, an inverted version of the first number of clock periods from the memory block;
    counting during a conversion period, a second number of clocks periods to determine a digital equivalent value of an analog signal amplitude; and
    storing the second number of clock periods in the memory block.

8. The method according to claim 7, wherein the analog signal is a pixel signal.

9. The method according to claim 7, wherein the clock periods correspond to a clock signal that is generated during a portion of each of the calibration phase and conversion phase.

10. The method according to claim 7, wherein a comparator compares a ramping signal with the analog signal.

11. The method according to claim 10, wherein the comparator is a two-stage comparator.

12. The method according to claim 7, comprising:
    reading the second number of clock periods from the memory block; and
    adding the inverted version of the first number of clock periods to the second number of clock periods.

13. A system for converting an analog signal to a digital signal, the system comprising:
    a counter configured to count, during a calibration phase, a first number of clock periods associated with a determined calibration offset, wherein the first number is one less than a number of clock periods associated with a determined offset;
    a memory block configured to store the first number of the clock periods in a memory block; and
    circuitry configured to read an inverted version of the first number of clock periods from the memory block,
    wherein the counter counts during a conversion period, a second number of clocks periods to determine a digital equivalent value of an analog signal amplitude, and the second number of clock periods is stored in the memory block.

14. The system according to claim 13, wherein the analog signal is a pixel signal.

15. The system according to claim 13, wherein the clock periods correspond to a clock signal that is generated during a portion of each of the calibration phase and conversion phase.

16. The system according to claim 13, comprising a comparator configured to compare a ramping signal with the analog signal.

17. The system according to claim 16, wherein the comparator is a two-stage comparator.

18. The system according to claim 13, wherein the circuitry reads the second number of clock periods from the memory block, and adds the inverted version of the first number of clock periods to the second number of clock periods.

19. A system for converting an analog signal to a digital signal, the system comprising:
    a counter configured to count, during a calibration phase, one less than a number of clock periods associated with a determined offset; and
    calibration memory configured to store the number of the clock periods,
    wherein inverted outputs are loaded, during a conversion phase, from the calibration memory to the counter, and the counter is enabled to count the clock periods to determine a digital equivalent value of an analog signal amplitude.

20. The system according to claim 19, wherein the analog signal is a pixel signal.

21. The system according to claim 19, wherein the clock periods correspond to a clock signal that is generated during a portion of each of the calibration phase and conversion phase.

22. The system according to claim 19, wherein a comparator compares a ramping signal with the analog signal.

23. The system according to claim 22, wherein the comparator is a two-stage comparator.

24. The system according to claim 19, comprising a memory block configured to store the digital equivalent value.

* * * * *